United States Patent [19]

Luyten

[11] Patent Number: 5,099,207
[45] Date of Patent: Mar. 24, 1992

[54] METHOD OF DETERMINING A NUCLEAR MAGNETIZATION DISTRIBUTION OF A SUB-VOLUME OF AN OBJECT, METHOD OF SHIMMING A PART OF A STEADY FIELD IN WHICH THE OBJECT IS SITUATED, AND MAGNETIC RESONANCE DEVICE FOR PERFORMING SUCH A METHOD

[75] Inventor: Peter R. Luyten, Eindhoven, Netherlands

[73] Assignee: U.S. Philips Corp., New York, N.Y.

[21] Appl. No.: 500,983

[22] Filed: Mar. 28, 1990

[30] Foreign Application Priority Data

Apr. 20, 1989 [NL] Netherlands ............... 8900990

[51] Int. Cl.$^5$ ............................................. G01R 33/20
[52] U.S. Cl. ....................................................... 324/309
[58] Field of Search ................. 324/300, 307, 309, 311, 324/320, 322; 128/653 A

[56] References Cited

U.S. PATENT DOCUMENTS

| | | | |
|---|---|---|---|
| 4,682,112 | 7/1987 | Beer | 324/322 |
| 4,703,270 | 10/1987 | Hall et al. | 324/309 |
| 4,703,272 | 10/1987 | Arakawa | 324/311 |
| 4,761,614 | 8/1988 | Prammer et al. | 324/320 |
| 4,893,080 | 1/1990 | Luyten et al. | 324/309 |
| 4,972,147 | 11/1990 | Van Vaals | 324/307 |

OTHER PUBLICATIONS

P. J. Hore, "Solvent Suppression in Fourier Transform Nuclear Magnetic Resonance" Journal of Magnetic Resonance, vol. 55, No. 2, Nov. 1983, pp. 283-300.
C. H. Sotak, "A Volume-Localized, Two-Dimensional NMR Method for the Determination of Lactate Using Zero-Quantum Coherence Created in a Stimulated Echo Pulse-Sequence", Magnetic Resonance in Medicine, vol. 7, No. 3, Jul. 1988, pp. 364-70.
J. Briand et al., "Voisiner, a New Method for Spatially Resolved NMR Spectroscopy", Journ. of Magnetic Resonance, vol. 80, No. 3, Nov. 1988, pp. 559-562.
P. A. Narayana et al., "In Vivo Localized Proton Spectroscopic Studies of Human Gastrocnemius Muscle", vol. 8, No. 2, Oct. 1988, pp. 151-159.
I. S. Mackenzie et al., "A Simple Field Map for Shimming", Magnetic Resonance in Medicine, vol. 5, No. 3, Sep. 1987, pp. 262-268.
D. M. Doddrell et al., "Nodal Inhomogeneity Mapping by Localized Excitation-The Nimble Shimming Technique for High-Resolution in Vivo NMR Spectroscopy", Magnetic Resonance in Medicine, vol. 7, No. 3, Jul. 1988, pp. 352-357.
P. R. Luyten et al., "Solvent-Suppressed Spatially Resolved Spectroscopy, An Approach to High-Resolution NMR on a Whole-Body MR System," Journal of Magnetic Resonance 67, 148-155 (1986).

Primary Examiner—Michael J. Tokar
Attorney, Agent, or Firm—Jack D. Slobod

[57] ABSTRACT

An MRI method for spectroscopy utilizes a sequence which includes four RF electromagnetic pulses (p1, p2, p3, p4), three of which are spatially selective to generate a resonance signal (e) from a sub-volume of an object. The phase difference between the first and the second 90° excitation pulse amounts to 90°. The waiting period (dt1) between the first and the second pulse (p1, p2) is chosen so that the second pulse (p2) selectively resets the nuclear spins excited by the first non-selective pulse (p1) in the longitudinal direction. The selectively reset magnetization, for example of fat, is recalled, after the dephasing of the non-reset magnetization, for example of water, by the further pulses (p3, p4). A spectrum is determined from the resonance signal (e). In a modified version in which the phases of the first and the second pulse are the same, the sequence is used for shimming a local field around the sub-volume.

13 Claims, 3 Drawing Sheets

METHOD OF DETERMINING A NUCLEAR MAGNETIZATION DISTRIBUTION OF A SUB-VOLUME OF AN OBJECT, METHOD OF SHIMMING A PART OF A STEADY FIELD IN WHICH THE OBJECT IS SITUATED, AND MAGNETIC RESONANCE DEVICE FOR PERFORMING SUCH A METHOD

BACKGROUND OF THE INVENTION

1. Field of the Invention

The invention relates to a method of determining a nuclear magnetization distribution from at least one magnetic resonance signal from a sub-volume of an object which is situated in a steady magnetic field, the sub-volume being selectively excited by means of a sequence comprising RF electromagnetic pulses and magnetic field gradients which are superposed on the steady magnetic field, resonance signals from at least a part of a spectrum associated with the sub-volume being suppressed.

The invention also relates to a method of shimming at least a part of a steady magnetic field in which a sub-volume of an object is situated, the sub-volume being selectively excited by means of a sequence comprising RF electromagnetic pulses and magnetic field gradients which are superposed on the steady magnetic field.

The invention furthermore relates to a magnetic resonance device for determining a nuclear magnetization distribution from at least one resonance signal from a sub-volume of an object, which device comprises means for exposing the object to a steady magnetic field and to a sequence of RF electromagnetic pulses and magnetic field gradients, the means being suitable for suppressing resonance signals from at least a part of a spectrum associated with the sub-volume, and means for detecting the resonance signal to be generated by means of the sequence.

2. Description of the Prior Art

A method of this kind is described in Journal of Magnetic Resonance 67, pp. 148-155, 1986. According to such a method an object is arranged in a steady magnetic field which is at least substantially uniform. The object is first exposed to a combination of a non-selective 90° excitation pulse, a non-selective 180° refocussing pulse, and a selective 90° reset pulse. During the reset pulse a first gradient is applied which is superposed on the steady magnetic field. It is thus achieved that a magnetization which was oriented in the same direction as the steady field is reset, after refocussing, along the z'-axis after having been rotated to the transverse direction in a coordinate system x'y'z' which rotates at the so-called Larmor frequency and whose z'-axis coincides with the steady magnetic field; in other words, after application of the pulse/gradient combination it is achieved that longitudinal magnetization exists only within a slice of the object and not outside this slice. Outside the slice only dephased transverse magnetization will exist after some time. Subsequently, such a pulse gradient combination is applied two more times, be it with a second and a third gradient, respectively. The field directions of the gradients coincide with the direction of the steady magnetic field, the gradient directions extending perpendicularly with respect to one another. After the three pulse/gradient combinations, the magnetization in a, for example cubic sub-volume of the object will have been selectively longitudinally reset after having been transversally set. Outside the sub-volume only dephased transverse magnetization exists. By using so-called phase cycling, any spurious signals from outside the sub-volume are further suppressed. In order to obtain a magnetic resonance signal from the selected sub-volume by means of which, for example a spectrum of the sub-volume can be determined, a 90° excitation pulse is generated. The resonance signal generated thereby is sampled and the spectrum is determined by means of Fourier transformation. In order to suppress, for example a water peak in the spectrum of the sub-volume, the latter 90° excitation pulse may be replaced by a so-called 1-$\bar{3}$-3-$\bar{1}$ composite pulse as described inter alia in Journal of Magnetic Resonance 55, pp. 283-300, 1983, notably on page 298-299 of this article. The method is notably suitable for use in so-called wholebody magnetic resonance devices. Even though such a method offers suitable results, it is a drawback that a large number of RF electromagnetic pulses (at least 10) must be generated in order to obtain a magnetic resonance signal from a sub-volume of the object.

SUMMARY OF THE INVENTION

It is inter alia an object of the invention to provide a magnetic resonance method and device whereby, for example water-suppressed spectra of sub-volumes can be obtained using fewer RF electromagnetic pulses.

A first method in accordance with the invention is characterized in that there is generated a first 90° excitation pulse which has a first phase and which is non-selective, after which a second excitation pulse which has a second phase which differs 90° from the first phase and which is selective is generated in the presence of a first magnetic field gradient, a waiting period between the first and the second pulse being chosen so that the suppression of said part of the spectrum is optimum and the first magnetic field gradient is sustained after the second excitation pulse until magnetic resonance signals from a further part of the spectrum have been dephased, after which a third, selective, excitation pulse is generated in the presence of a second magnetic field gradient and a selective refocussing pulse is generated in the presence of a third magnetic field gradient, the first, the second and the third field gradient having different gradient directions. This enables suitable suppression of, for example a water peak in a spectrum whereas, for example $CH_n$ groups are shown. By a suitable choice of the waiting period optimum suppression of the water peak can be achieved. The invention is based on the idea to expose the object to an RF electromagnetic field after the magnetization of the object has been rotated in the transverse direction and after expiration of a suitable waiting period during which the water magnetization vector remains stationary in a coordinate system which rotates at the Larmor frequency of water and vectors of other substances rotate due to chemical shift, the direction of said RF electromagnetic field coinciding with the water vector so that in one operation the magnetization is reset in the longitudinal direction with the exception of that of water, that is to say in the direction of the steady magnetic field, after which the water is transversally dephased by sustaining a gradient and by using further volume selection. Contrary to the described known method which utilizes three reset pulses, only one reset pulse is now required.

It is to be noted that pulse sequences are known in which three excitation pulses are successively generated, for example from U.S. Pat. No. 4,748,409. The three excitation pulses are 90° pulses. Contrary to the method in accordance with the invention, however, all nuclear spins are dephased after the first RF pulse; moreover, only 50% of the intensity of the reset magnetization is obtained upon excitation thereof, while the method in accordance with the invention achieves substantially 100% in the central part of the spectrum of interest. A method as known from Fig. 3 in European Patent Application EP 0.304.984 which corresponds to commonly owned U.S. Pat. No. 4,893,080, is a version of the method known from the cited U.S. Pat. No. 4,748,409. Again all nuclear spins are dephased after the first RF pulse. Therefore, the method in accordance with the invention is distinct from these so-called stimulated echo methods in that it involves a combination of RF electromagnetic pulses and gradients so that an essentially different operation is obtained.

A version of a method in accordance with the invention is characterized in that the waiting period is in conformity with $(2n+1)/(4df)$, where df is a frequency difference in the spectrum of a resonance frequency of a resonance peak from the suppressed part of the spectrum and a resonance frequency of a frequency peak from the further part of the spectrum, and where n is a non-negative integer number. For example, if the resonance peak from the suppressed part of the spectrum is a water peak and the other peak is a CH peak from the central part of the spectrum of interest, it is achieved that the CH peak is phase-shifted 90° with respect to the water peak, and is optimally recalled later after having been reset.

A further version of a method in accordance with the invention is characterized in that the presaturation is performed by generating an RF electromagnetic pulse whose frequency contents correspond to the suppressed part of the spectrum, followed by a dephasing gradient. The water is then at least partly suppressed already before the sequence, i.e. inside as well as outside the sub-volume to be selected.

A second method in accordance with the invention is characterized in that there is generated a first 90° excitation pulse which is non-selective, after which a second excitation pulse which is selective is generated in the presence of a first magnetic field gradient, the phases of the first and the second pulse being the same, a waiting period between the first and the second pulse being chosen so that a phase difference of substantially 90° arises between at least two spectral components of a spectrum associated with the sub-volume, the first gradient being sustained until selective dephasing occurs, after which a third, selective, excitation pulse is generated in the presence of a second magnetic field gradient and a selective refocussing pulse is generated in the presence of a third magnetic field gradient, the sequence being repeated so many times, while varying shimming currents in coils in order to shim the steady magnetic field, that an optimum resonance signal is obtained from the sub-volume. By making the phase difference between the first and the second RF electromagnetic pulse 0° instead of 90°, the method can be made suitable for shimming the steady field around a sub-volume. After that the first method can be used. Thus, a spectrum having an even higher resolution is obtained.

BRIEF DESCRIPTION OF THE DRAWING

The invention will be described in detail hereinafter with reference to a drawing; therein.

DETAILED DESCRIPTION OF THE PREFERRED EMBODIMENTS

Figure 1:
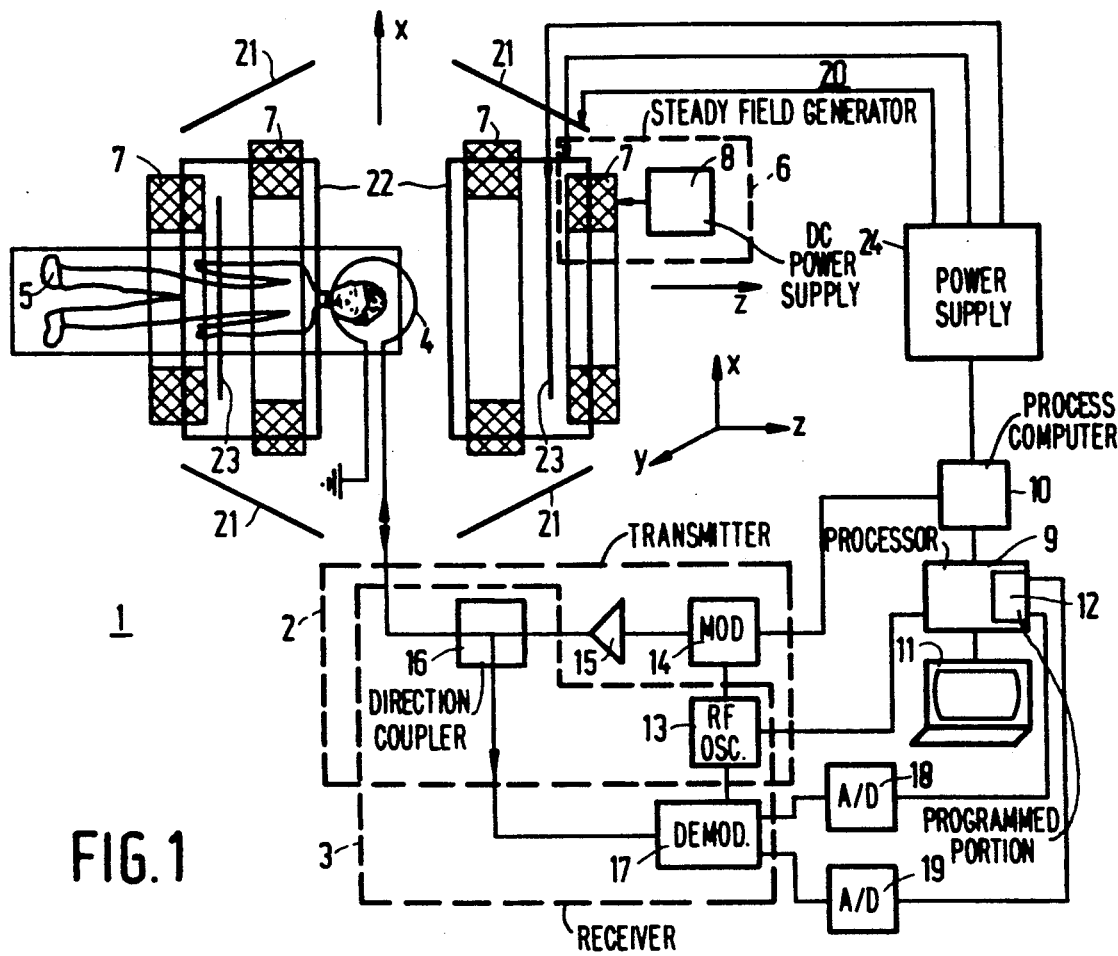
FIG. 1 diagrammatically shows a magnetic resonance device in accordance with the invention.

FIG. 1 diagrammatically shows a magnetic resonance device 1 in accordance with the invention, comprising transmitter means 2 and receiver means 3 for transmitting RF electromagnetic pulses, via a transmitter/receiver coil 4, to an object 5 and for receiving magnetic resonance signals, respectively, which are generated in the object 5 by the RF electromagnetic pulses, which object is situated in a steady, uniform magnetic field. The device 1 comprises means 6 for generating the steady field. The means 6 comprise magnet coils 7 and, in the case of resistive magnets or superconducting magnets, a DC power supply 8. During operation of the device 1 with the object arranged within the magnet coils 7, a small excess of nuclear spins (of nuclei having a magnetic moment) will be directed in the same direction as the steady uniform field in the state of equilibrium. From a macroscopic point of view this is to be considered as a magnetization M, being an equilibrium magnetization. The device 1 also comprises processing means 9 which are coupled to the transmitter means 2 and the receiver means 3, a process computer 10 which is coupled to the processing means 9 and the transmitter means 2, and display means 11 for displaying a nuclear magnetization distribution which is determined, using programmed means 12, from resonance signals received and demodulated by the receiver means 3 after signal sampling thereof (detection of resonance signals). The transmitter means 2 actually comprise an RF oscillator 13 for generating a carrier signal, a modulator 14 for amplitude and/or phase or frequency modulation of the carrier signal, a power amplifier 15 and a directional coupler 16 which is coupled to the transmitter/receiver coil 4. The transmitter/receiver coil 4 may be a coil which encloses the entire object 5, a coil which encloses a part of the object 5, or a surface coil. The RF oscillator 13 is coupled to the processing means 9 and the modulator 14 is coupled to the process computer 10. When excitation pulses are applied to the object 5 via the transmitter means 2 and under the control of the programmed means 12, which excitation pulses have a frequency contents around the Larmor frequency of, for example protons, magnetic resonance signals will be produced wherefrom a proton spectrum can be determined by the programmed means 12 by way of, for example Fourier transformation. The receiver means 3 for receiving the resonance signals comprise the directional coupler 16 and a receiver and demodulation unit 17. The unit 17 is, for example a double phase-sensitive detector whose output signals are sampled by means of a first and a second A/D converter 18, 19, respectively. The first and the second A/D converter 18, 19 are coupled to the processing means 9. In the case of separate transmitter and receiver coils, the directional coupler 16 is absent. The device also comprises means 20 for generating magnetic field gradients which are superposed on the steady, uniform magnetic field. The means 20 comprise gradient magnet coils 21, 22 and 23 for generating a magnetic field gradient $G_x$, $G_y$ and $g_z$, respectively, and a power supply unit 24 which can be controlled by the process computer in order to power the gradient magnet coils 21, 22 and 23 which are separately activatable. In the embodiment shown the arrangement in space of the gradient magnet coils is such that the field direction of the magnet field gradients coincides with the direction of the steady, uniform magnetic field and that the gradient directions extend mutually perpendicularly; this is shown in FIG. 1 by way of three mutually perpendicular axes x, y and z. When pulse/gradient sequences are applied to the object 5, the resonance signals can be used inter alia for spectroscopy, location-dependent spectroscopy and spectroscopic imaging. The device 1 may also comprise shimming coils which are not shown in detail. These shimming coils are to be activated by the programmed means.

Figure 2:
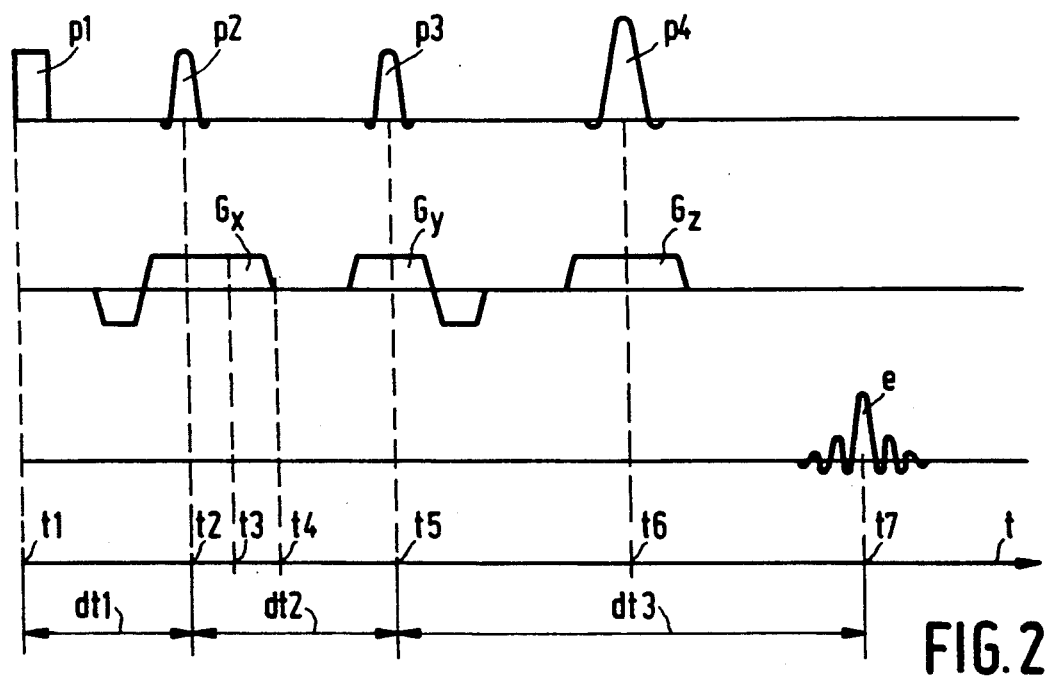
FIG. 2 shows a sequence in accordance with the invention.
Figure 3A:
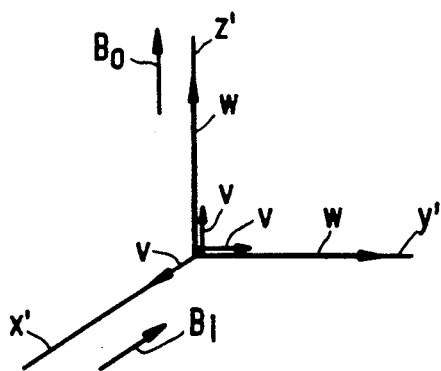
FIGS. 3A and 3B show magnetization vectors for the sequence shown in FIG. 2, FIGS. 4A and 4B show spectra of resonance signals with suppression curves for $n=0$ and $n=1$.
Figure 3B:
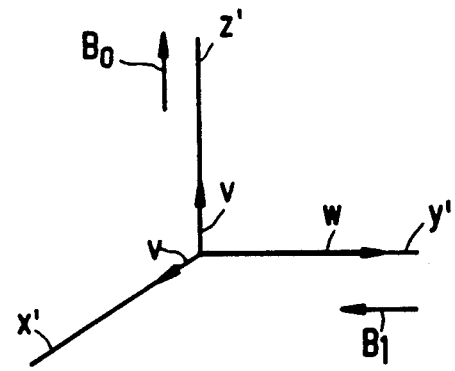

FIG. 2 shows a sequence in accordance with the invention as a function of time t; the references t1 to t7 denote some instants. Under the control of the programmed means 12 the transmitter means 2 generate a first RF electromagnetic, non-selective pulse p1 at the instant t=t1. The pulse p1 is applied to the object 5 by the transmitter/receiver coil 4, so that nuclear spins are excited in the object 5. The amplitude and the duration of the pulse p1 are such that in a coordinate system x'y'z' which rotates at a Larmor frequency of, for example water and whose z'-axis coincides with the steady field $B_0$, a nuclear magnetization vector is rotated through 90° with respect to the field $B_0$, i.e. p1 is a so-called 90° pulse. This is shown in FIG. 3A. The frequency contents of the pulse p1 are such that substantially all nuclear spins are excited; the pulse p1 is nonselective. Subsequently, at the instant t=t2 a second, selective 90° excitation pulse is generated after a waiting period following the pulse p1. During the pulse p2 the means 20 generate a magnetic field gradient. The phase of the pulse p2 differs 90° from that of the pulse p1. If the object contains other components in addition to water, for example fat, a water vector W will be stationary in the rotating system x'y'z' due to chemical shift, and a fat vector V will rotate with a difference frequency between water and fat. The phase of the pulse p1 is such that the direction of the RF electromagnetic field $B_1$ extends perpendicularly to the y'z'-plane as shown in FIG. 3A. When the waiting period dt1 is chosen so that the magnetization vectors around the resonance frequency of the fat in the x'y'-plane are rotated substantially 90° with respect to the water at the instant t=t2, these magnetization vectors will be longitudinally set due to the pulse p2, i.e. along the z''-axis and, because of the fact that the electromagnetic field $B_1$ extends along the water vector as shown in FIG. 3B, this field will not have an effect on the water; in other words, the pulse p2 acts as a selective reset pulse. At the instant t= t3 the transverse magnetization still present will have been rephased inside and outside a slice. By sustaining the gradient $G_x$ until the instant t=t4 (for example, for 1 ms or longer), this transverse magnetization will be dephased. It is achieved that longitudinal magnetization (of magnetization vectors having a resonance frequency around that of fat) exists selectively in a slice and that outside the slice only dephased transverse magnetization exists. Spurious echos which could arise due to field inhomogeneities can be suppressed by phase cycling. The selective longitudinal magnetization can be produced by means of a spin echo sequence which is indicated in FIG. 2, comprising a third, slice-selective 90° excitation pulse at the instant t=t5, in the presence of a magnetic field gradient $G_y$, and a selective 180° refocussing pulse at the instant t=t6 in the presence of a magnetic field gradient $G_z$. At the instant t=t7 an echo resonance signal e arises which originates from a selected sub-volume of the object 5. The second and the third excitation pulse may be chosen to be smaller than 90°; the signal strength of the echo resonance signal e is not optimum in that case. Waiting periods between p2 and p3 and between p3 and p4 are denoted by dt2 and dt3, respectively. After detection of the resonance signal e by the receiver of means 5 and after sampling of the detected signal by means of the A/D converters 18 and 19, for example a water-suppressed spectrum can be derived from the detected and sampled signal, using the programmed means 12, by Fourier transformation, which spectrum can be displayed by means of the display means 11.

Figure 4A:
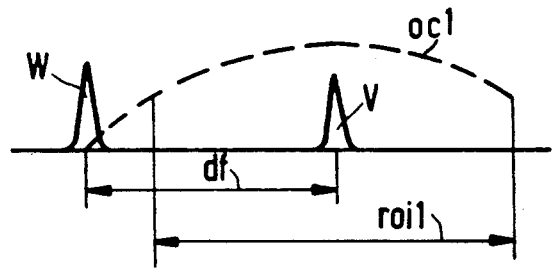
Figure 4B:
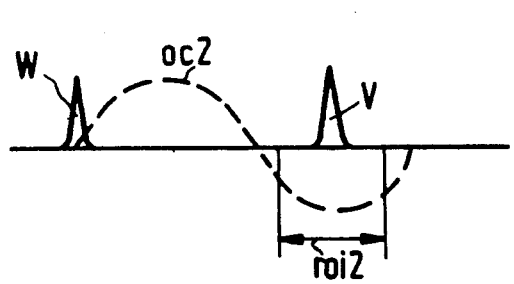

FIGS. 4A and 4B show spectra of resonance signals with suppression curves oc1 and oc2. FIG. 4A shows a water peak W and a fat peak V. It will be evident that spectra may be more complex and that the sequence shown can be used for spectra other than those in which water peaks and fat peaks occur. By a suitable choice of the waiting period $dt1 = (2n+1)/(4df)$, where df is the chemical shift between the water peak W and the fat peak V and n is an integer, non-negative number, it can be achieved that the water peak W and its vicinity in the spectrum are at least substantially suppressed. FIG. 4A shows a suppression curve oc1 for n=0. In the case of a chemical shift df of, for example 170 Hz, dt1 would then be approximately 1.5 ms; this could be too short in practice for switching inter alia gradients. The spectrum of interest around the fat peak V is denoted by the reference roi1. When dt1 is too short for the switching of gradients, n=1 may be chosen, and dt1 will be 4.5 ms. The suppression curve oc2 in FIG. 4B, however, is more complex than the suppression curve oc1 in FIG. 4A. An area around the fat peak in a rather flat part of the suppression curve oc2 may be taken as the region of interest roi2.

Figure 5:
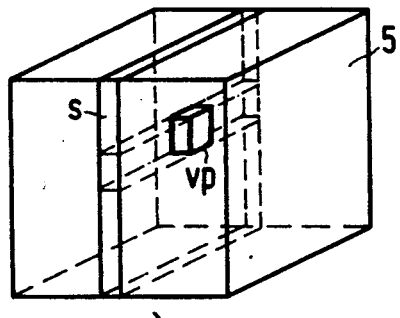
FIG. 5 shows a sub-volume in an object selected by means of the sequence in accordance with the invention.

FIG. 5 shows a sub-volume vp in an object 5 which has been selected by means of the sequence in accordance with the invention. The sub-volume vp is selected by the respective gradients $G_x$, $G_y$ and $G_z$ during the pulses p2, p3 and p4 as an intersection of three slices, such as the slice s by the gradient $G_x$. It will be evident that the sequence is effective for all permutations of $G_x$, $G_y$ and $G_z$.

Figure 6:
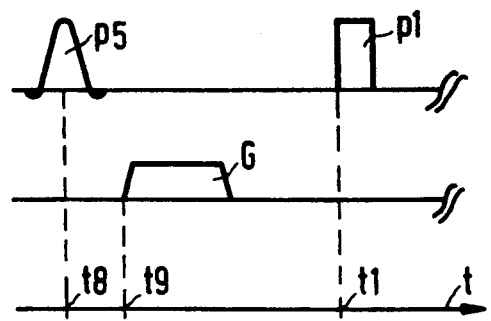
FIG. 6 shows presaturation prior to the sequence in accordance with the invention.

FIG. 6 shows presaturation in accordance with the invention. The references p1 and t1 denote the first pulse p1 at the instant t=t1, like in FIG. 2. The entire object 5 is selectively excited, for example for water by means of a presaturation pulse p5 at the instant t=t8. The pulse p5 may be selective 90° pulse, such as a long Sinc pulse, having a bandwidth of, for example 10–20 Hz around the water. The application of a gradient G at the instant t=t9 will dephase the selectively excited water, so that the water has been presaturated at the instant t=t1.

Figure 7:
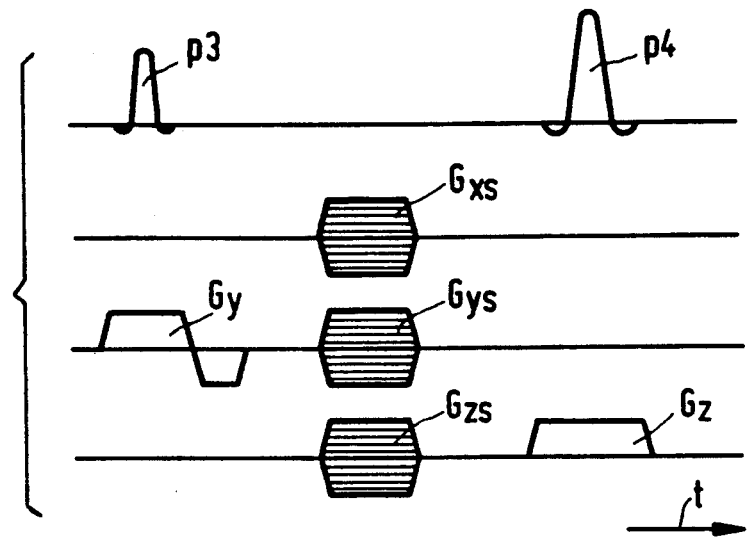
FIG. 7 shows a sequence adapted to spectroscopic imaging in accordance with the invention.

FIG. 7 shows a sequence adapted to spectroscopic imaging in accordance with the invention. Between the pulses p3 and p4 of the pulse sequence of FIG. 2 two and three gradients $G_{xs}$, $G_{ys}$ and $G_{zs}$ are applied for 2D spectroscopic imaging and 3D spectroscopic imaging, respectively. The sequence is repeated for different amplitudes of $G_{xs}$, $G_{ys}$ and $G_{zs}$. From sampling values of the resonance signals a large number of VOIs (volume of interest) can be determined by means of the programmed means 12, or a density image of a given spectral peak can be determined.

Figure 8A:
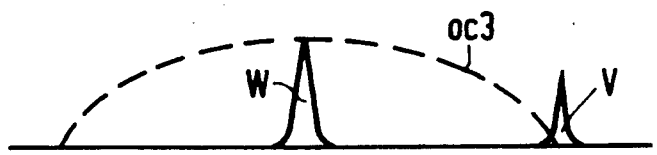
FIGS. 8A and 8B show that the sequence in accordance with the invention can be used for the shimming of a sub-volume.
Figure 8B:
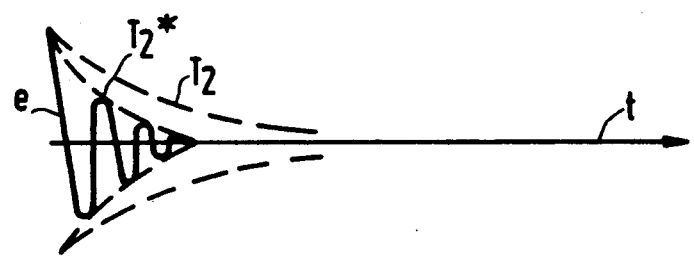

FIGS. 8A and 8B show that the sequence in accordance with the invention can be used for the shimming of a sub-volume. In that case the phases of the pulses p1 and p2 are chosen to be equal and the waiting period dt1 is chosen so that fat is actually suppressed and water is not. In FIG. 8A this is denoted by the suppression curve oc3 (for n=0). The device 1 then comprises shimming coils whereby the steady field can be locally influenced by variation of the currents through the shimming coils. The currents can be adjusted by the programmed means 12. The sequence can be repeated a number of times while varying the currents until an optimum water signal is obtained from the sub-volume. This signal can be evaluated by observing the Fourier transformed water signal while varying the currents. When the magnetic field in the sub-volume is uniform, the water resonance signal will relax substantially with a time constant $T_2$, being the transverse relaxation time of water. When the magnetic field is still not uniform, transverse relaxation will take place with a time constant $T_2^*$ which is smaller than $T_2$. This is shown in FIG. 8B.

The sequence shown can be executed using, for example, the time parameters: dt1=4.5 ms, dt2=5 ms, dt3=8-500 ms and a waiting period of 1-2 s after the resonance signal e. When dt3 is chosen to be small, the echo time will be short. The sequence shown is then also very suitable for spectroscopy of quickly moving organs such as the heart in the case of an object in the form of a human body.

I claim:

1. A method of determining a nuclear magnetization distribution from at least one magnetic resonance signal from a sub-volume of an object which is situated in a steady magnetic field, the sub-volume being selectively excited by means of a sequence comprising RF electromagnetic pulses and magnetic field gradients which are superposed on the steady magnetic field, resonance signals from at least a part of a spectrum associated with the sub-volume being suppressed, characterized in that there is generated a first 90° excitation pulse which has a first phase and which is non-selective, after which a second excitation pulse which has a second phase which differs 90° from the first phase and which is selective is generated in the presence of a first magnetic field gradient, a waiting period between the first and the second pulse being chosen so that the suppression of said part of the spectrum is optimum and the first magnetic field gradient is sustained after the second excitation pulse until magnetic resonance signals from a further part of the spectrum have been dephased, after which a third, selective, excitation pulse is generated in the presence of a second magnetic field gradient and a selective refocussing pulse is generated in the presence of a third magnetic field gradient, the first, the second and the third field gradient having different gradient directions.

2. A method as claimed in claim 1, characterized in that the waiting period is in conformity with $(2n+1)/(4df)$, where df is a frequency difference in the spectrum of a resonance frequency of a resonance peak from the suppressed part of the spectrum and a resonance frequency of a frequency peak from the further part of the spectrum, and where n is a non-negative integer number.

3. A method as claimed in claim 2, characterized in that the frequency peak from the suppressed part of the spectrum is a water peak.

4. A method as claimed in claim 1, characterized in that the first magnetic field gradient is sustained for at least 1 ms after the rephasing of transverse magnetization has occurred due to the second pulse.

5. A method as claimed in claim 1, characterized in that phase cycling is used for suppressing spurious signals originating from outside the selected sub-volume by executing the sequence twice with a 180° phase difference of the second excitation pulse and by subtracting the respective resonance signals from one another.

6. A method as claimed in claim 1, characterized in that at least one magnetic field gradient is applied between the third excitation pulse and the refocussing pulse in order to obtain magnetic resonance signals for spectroscopic imaging, the sequence being repeated a number of times for different values of the at least one magnetic field gradient.

7. A method as claimed in claim 1, characterized in that the second and third excitation pulse are 90° pulses, the selective refocussing pulse being a 180° pulse.

8. A method as claimed in claim 1, characterized in that prior to the sequence presaturation takes place on a resonance frequency from the suppressed part of the spectrum.

9. A method as claimed in claim 8, characterized in that the presaturation is performed by generating an RF electromagnetic pulse whose frequency contents correspond to the suppressed part of the spectrum, followed by a dephasing gradient.

10. A method of shimming at least a part of a steady magnetic field in which a sub-volume of an object is situated, the sub-volume being selectively excited by means of a sequence comprising RF electromagnetic pulses and magnetic field gradients which are superposed on the steady magnetic field, characterized in that there is generated a first 90° excitation pulse which is non-selective, after which a second excitation pulse which is selective is generated in the presence of a first magnetic field gradient, the phases of the first and the second pulse being the same, a waiting period between the first and the second pulse being chosen so that a phase difference of substantially 90° arises between at least two spectral components of a spectrum associated with the sub-volume, the first gradient being sustained until selective dephasing occurs, after which a third, selective, excitation pulse is generated in the presence of a second magnetic field gradient and a selective refocussing pulse is generated in the presence of a third magnetic field gradient, the sequence being repeated so many times, while varying shimming currents in coils in order to shim the steady magnetic field, that an optimum resonance signal is obtained from the sub-volume.

11. A magnetic resonance device for determining a nuclear magnetization distribution from at least one resonance signal from a sub-volume of an object, which device comprises means for exposing the object to a steady magnetic field and to a sequence of RF electromagnetic pulses and magnetic field gradients, the means being suitable for suppressing resonance signals from at least a part of a spectrum associated with the sub-volume, and means for detecting the resonance signal to be generated by means of the sequence, characterized in that the means for subjecting the object to the sequence are suitable for generating a first 90° excitation pulse which has a first phase and which is non-selective, for subsequently generating, in the presence of a first magnetic field gradient, a second excitation pulse which has a second phase which deviates 90° from the first phase and which is selective, a waiting period between the first and the second pulse being chosen so that the suppression of said part of the spectrum is optimum, the first magnetic field gradient after the second excitation pulse being sustained until magnetic resonance signals from a further part of the spectrum have been dephased, and for subsequently generating, in the presence of a second magnetic field gradient, a third, selective, excitation pulse and a selective refocussing pulse in the presence of a third magnetic field gradient, the first, the second and the third field gradient having different gradient directions.

12. A method as claimed in claim 2, characterized in that the first magnetic field gradient is sustained for at least 1 ms after the rephasing of transverse magnetization has occurred due to the second pulse.

13. A method as claimed in claim 2, characterized in that phase cycling is used for suppressing spurious signals originating from outside the selected sub-volume by executing the sequence twice with a 180 phase difference of the second excitation pulse and by subtracting the respective resonance signals from one another.

* * * * *